United States Patent [19]

Mikata et al.

[11] Patent Number: 5,250,463

[45] Date of Patent: Oct. 5, 1993

[54] METHOD OF MAKING DOPED SEMICONDUCTOR FILM HAVING UNIFORM IMPURITY CONCENTRATION ON SEMICONDUCTOR SUBSTRATE

[75] Inventors: Yuuichi Mikata, Kawasaki; Katsunori Ishihara; Katsuya Okumura, both of Yokohama, all of Japan

[73] Assignee: Kabushiki Kaisha Toshiba, Kawasaki, Japan

[21] Appl. No.: 719,362

[22] Filed: Jun. 24, 1991

[30] Foreign Application Priority Data

Jun. 26, 1990 [JP] Japan ................. 2-167989

[51] Int. Cl.$^5$ ............................ H01L 21/20
[52] U.S. Cl. ................... 437/109; 437/233; 437/967; 437/971; 437/165
[58] Field of Search ........... 437/109, 967, 971, 233, 437/165

[56] References Cited

U.S. PATENT DOCUMENTS 4,927,786  5/1990  Nishida ................. 437/105
5,198,387  3/1993  Tang .................... 437/165

FOREIGN PATENT DOCUMENTS 0035426  2/1984  Japan .
0120240  7/1984  Japan .
0114519  6/1986  Japan .
0035516  2/1987  Japan ................. 437/971

OTHER PUBLICATIONS

Duchemin et al.; "Kinetics of silicon growth under low hydrogen pressure", J. Electrochem Soc.; vol. 125, No. 4, 1978; pp. 637–644.

*Primary Examiner*—Brian E. Hearn
*Assistant Examiner*—Trung Dang
*Attorney, Agent, or Firm*—Finnegan, Henderson, Farabow, Garrett & Dunner

[57] ABSTRACT

For providing a doped semiconductor film having uniform thickness and a uniform impurity concentration on a semiconductor substrate, both a raw gas such as silane and an impurity gas such as phosphine are prepared. Thereafter, the raw gas is introduced into a reaction chamber, while a decomposed impurity gas, that is obtained by means for decomposing the impurity gas, is introduced into the reaction chamber, thereby depositing a doped semiconductor film such as a polysilicon film on the semiconductor substrate. A sub-reaction chamber, a plasma discharge device and a light source are used as the means for decomposing the impurity gas.

7 Claims, 4 Drawing Sheets

METHOD OF MAKING DOPED SEMICONDUCTOR FILM HAVING UNIFORM IMPURITY CONCENTRATION ON SEMICONDUCTOR SUBSTRATE

BACKGROUND OF THE INVENTION

1. Field of the Invention

The present invention relates to a method of making a semiconductor film having a uniform thickness and a uniform impurity concentration, and an apparatus for making the same.

2. Description of the Related Art

For providing semiconductor devices, semiconductor films have been often formed on substrates, and a semiconductor film of polysilicon has been particularly widely utilized as electrodes or wiring layers. The semiconductor film has been provided by the LPCVD (Low Pressure Chemical Vapor Deposition) method which is on of the most popular methods.

Conventionally, a semiconductor film of doped polysilicon has been formed as described below. An undoped polysilicon film is first deposited on a substrate using the LPCVD method, and an impurity is then introduced thereinto using thermal diffusion of ion-implantation techniques.

In order to further decrease the number of steps of forming a semiconductor film, the following deposition method has been used. That is, when a polysilicon film is deposited on a substrate using the LPCVD, an impurity is simultaneously added to the semiconductor film of polysilicon.

A conventional method of forming a semiconductor film of polysilicon will be described below with reference to FIGS. 6 and 7.

FIG. 6 is a schematic view showing an apparatus for forming a semiconductor film, and FIG. 7 is a graph showing a relation between an impurity concentration in the semiconductor film and a deposition rate of the semiconductor film. Referring to FIG. 6, the apparatus for forming the semiconductor film will be described. Reference numeral 1 denotes a vertical reaction chamber which places substrates such as a plurality of semiconductor substrates 2 on which a semiconductor film is deposited under a reduced pressure. A heater 3 is arranged around the side wall to heat the inside of the reaction chamber 1 to a predetermined temperature. The upper portion of the reaction chamber 1 is provided with an exhaust port 4 which is connected to a vacuum pump (not shown) for exhausting the inside of the chamber t reduce a pressure to a predetermined value. A first gas supply pipe 5 and a second gas supply pipe 6 for supplying gases to the reaction chamber 1 are arranged at the lower portion of the side wall of the reaction chamber 1. A raw gas such as monosilane (SiH$_4$) is introduced into the reaction chamber 1 through a first valve 9 from a supply port 7 of the first gas supply pipe 5, while an impurity gas such as phosphine (PH$_3$) is introduced through a second valve 10 from a supply port 8 of the second gas supply pipe 6 thereinto. Each gas supply source is arranged at one end of the corresponding one of the gas supply pipes. Reference numeral 11 denotes a quartz boat standing in the reaction chamber 1, and a plurality of semiconductor substrates 2 are horizontally held on a plurality of shelves of the boat 11 one by one. At this time, a space for circulating the gases is provided between the substrates 2.

A method of forming a semiconductor film on a substrate by using the apparatus arranged as described above will be described below.

A plurality of semiconductor substrates 2 held on the boat are placed in the reaction chamber 1, and the reaction chamber is evacuated by the vacuum pump to have a predetermined pressure and kept at a predetermined temperature by the heater 3. Subsequently, while the reaction chamber is evacuated by the vacuum pump, the first valve 9 and the second valve 10 are opened, and monosilane and phosphine are simultaneously introduced into the reaction chamber 1 at corresponding predetermined flow rates through first and second supply pipes 5 and 6. The polysilicon film having a predetermined thickness and containing an impurity of phosphorus is deposited on the semiconductor substrate 2. Thereafter, the valves are closed, and the vacuum of the reaction chamber 1 is broken to provide the semiconductor substrates 2 each having the phosphorus-doped polysilicon film.

However, there are provided the following problems when the phosphorus-doped polysilicon film is formed as described above. In FIG. 7, the abscissa represents a distance between the gas supply port to a substrate 2, and the ordinate represents the impurity concentration in a semiconductor film and a deposition rate of the semiconductor film. As is apparent from FIG. 7, the impurity concentration and the deposition rate of the polysilicon film are changed according to positions of the semiconductor substrates 2 in the reaction chamber 1, i.e., the distances from the gas supply ports 7 and 8 at corresponding ends of the first and second gas supply pipes 5 and 6 to the semiconductor substrates 2. That is, the thicknesses of films formed on semiconductor substrates are not uniform due to the following reasons. When the impurity (P) is deposited on the surface of the semiconductor film (polysilicon film), the deposition rate is decreased because a deposition probability of semiconductor atoms (Si) is reduced. In addition, since the thermal decomposition rate of the impurity gas (PH$_3$) for supplying the impurity (P) is different from the thermal decomposition rate of the raw gas (SiH$_4$) for forming the semiconductor film in the reaction chamber, the concentration distribution of the impurity gas (PH$_3$) is locally changed.

A second conventional method of forming a semiconductor film free from a concentration gradient of an impurity gas caused by the difference between thermal decomposition rates will be described below The second method will be described below by the same apparatus as in the first method.

After a plurality of semiconductor substrates 2 held on the boat 11 are placed in the reaction chamber 1, the reaction chamber 1 is evacuated to have a predetermined pressure and held at a predetermined temperature by the heater 3. Subsequently, only the first valve 9 is opened, and monosilane is supplied to the reaction chamber 1 from the supply port 7 of the first gas supply pipe 5 at a predetermined flow rate. At this time, the second valve 10 is closed. A polysilicon layer having a predetermined thickness thinner than a final thickness is deposited on each of the semiconductor substrates 2. While the first valve 9 is closed, the second valve 10 is opened to supply phosphine to the reaction chamber 1 from the supply port 8 of the second gas supply pipe 6 at a predetermined flow rate. Phosphorus is formed on and added to the polysilicon film deposited on the semiconductor substrate 2. In addition, by the above procedure, monosilane and phosphine are independently and alternately introduced into the reaction chamber 1 to repeat the deposition of polysilicon film and the formation and addition of phosphorus, thereby forming a phosphorus-doped polysilicon film having the predetermined final thickness. Thereafter, the valves are closed, the vacuum of the reaction chamber 1 is broken, and the semiconductor substrates 2 each having the phosphorus-doped polysilicon film are taken from the reaction chamber 1.

However, there are provided the following problems when the phosphorus-doped polysilicon film is formed as described above. According to the method, the uniformity of the films formed on the semiconductor substrates 2 may be improved. However, in order to provide a thick polysilicon film containing a high phosphorus concentration, it must be frequently repeated to introduce monosilane and phosphine into the reaction chamber separately. Therefore, the working time may be increased, and even if films having the same thickness are obtained, the phosphorus concentration cannot be increased more than a predetermined value by the step repetition due to the following reason. Since an amount of adsorption of phosphorus to the polysilicon film is constant, the phosphorus concentration to be added cannot be increased if the film thickness accomplished by one film deposition step is reduced.

SUMMARY OF THE INVENTION

It is, therefore, an object of the present invention to provide a method of forming a semiconductor film, having a uniform thickness and a uniform, high impurity concentration, on a semiconductor substrate.

It is another object of the present invention to provide an apparatus for making a semiconductor film, having a uniform thickness and a uniform, high impurity concentration, on a semiconductor substrate.

According to an aspect of the present invention, there is provided a method of depositing a doped semiconductor film on a semiconductor substrate. After preparing both a raw gas such as silane for making a semiconductor film on a semiconductor substrate and an impurity gas such as phosphine for adding an impurity to the semiconductor film, the raw gas is introduced into a reaction chamber, while a decomposed impurity gas, that is obtained by means for decomposing the impurity gas, is introduced into the reaction chamber, thereby depositing a doped semiconductor film such as a polysilicon film on the semiconductor substrate.

According to another aspect of the present invention, there is provided an apparatus for depositing a doped semiconductor film on a semiconductor substrate according to the design incorporated in the first aspect of the present invention.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

Figure 1:
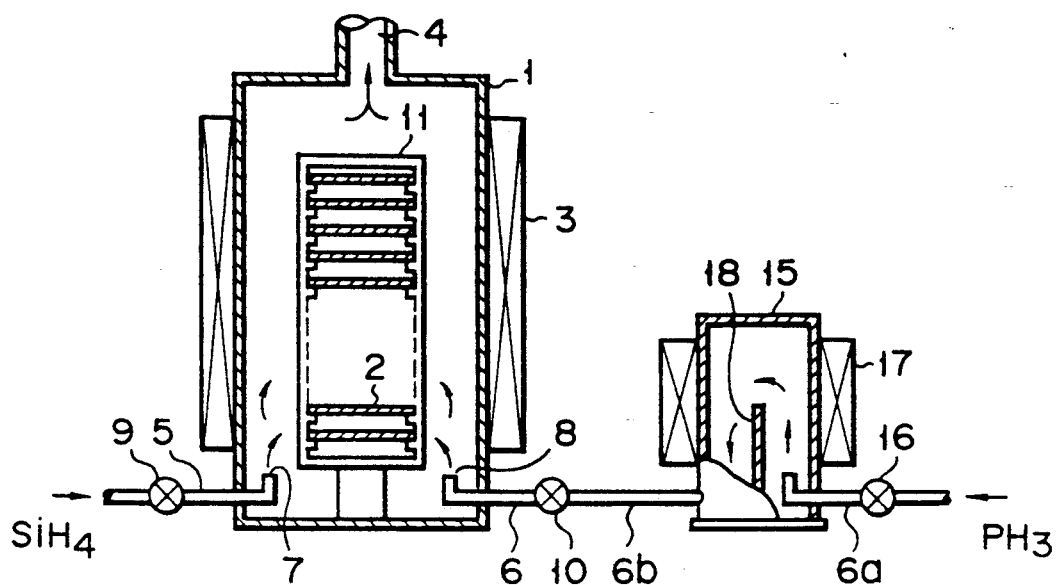
FIG. 1 is a schematic view showing an apparatus for forming a semiconductor film on semiconductor substrates according to first and second embodiments of the present invention.

Embodiments of the present invention will be described below with reference to the accompanying drawings. Note that the same reference numerals as in the conventional manufacturing apparatus denote the same parts in the embodiments of the present invention, and the description thereof will be omitted.

The first embodiment of the present invention will be described below with reference to FIGS. 1 and 2.

Figure 2:
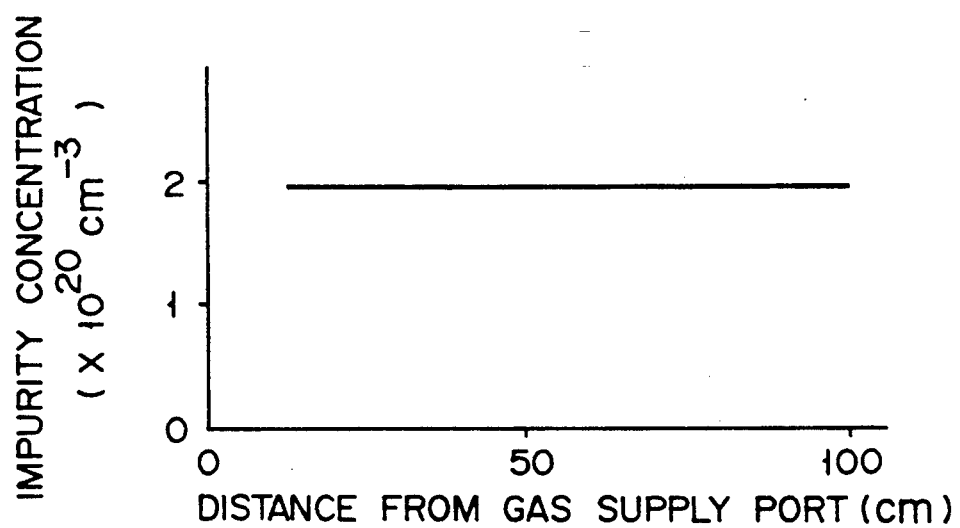
FIG. 2 is a graph showing an impurity concentration in a semiconductor film.

Referring to FIG. 1, reference numeral 15 denotes a vertical sub-reaction chamber. Independent of the reaction chamber 1, the sub-reaction chamber 15 is connected between the second valve 10 of the second gas supply pipe 6 and the gas supply source (not shown) for phosphine, and is disposed near the reaction chamber 1. A supply pipe 6a connects the gas supply source of the second gas supply pipe 6 to the sub-reaction chamber 15, and a third valve 16 is provided at the supply pipe 6a. A supply pipe 6b connects the sub-reaction chamber 15 of the second gas supply pipe 6 to the reaction chamber 1. In addition, a sub-heater 17 is provided on the outer peripheral surface of the side wall of the sub-reaction chamber 15 so as to heat the inside of the sub-reaction chamber 15 to a predetermined temperature. In order to prevent a gas, supplied from the gas supply source through the supply pipe 6a, from being directly supplied to the reaction chamber 1 through the second supply pipe 6, a partition 18 having a height corresponding to a distance from the bottom surface of the sub-reaction chamber 15 to the half thereof is arranged to separate the inside of the sub-reaction chamber 15 into two parts.

A method of forming a semiconductor film on a substrate using the apparatus as described above will be described below.

A plurality of substrates, i.e., semiconductor substrates 2 are placed on the boat 11 in the reaction chamber 1. The inside of the reaction chamber 1 is heated by the heater 3 and kept at a temperature of 580° C. Similarly, the inside of the sub-reaction chamber 15 is heated by the sub-heater 17 and kept at a temperature of 700° C. While the first valve 9 and the third valve 16 are closed, the second valve 10 is opened to evacuate the reaction chamber 1 by the vacuum pump (not shown) connected to the exhaust port 4, thereby keeping both the reaction chamber 1 and the sub-reaction chamber 15 at a pressure of 0.5 Torr. The first valve 9 and the third valve 16 are opened, and a monosilane gas serving as a raw gas is introduced into the reaction chamber 1 at a flow rate of 100 SCCM (Standard Cubic Centimeter per Minute) through the first gas supply pipe 5. At the same time, phosphine of the impurity gas is introduced into the reaction chamber 1 at a flow rate of 10 SCCM through the second gas supply pipe 6. In this case, the phosphine supplied from the gas supply source to the sub-reaction chamber 15 through the supply pipe 6a is heated while passing through the sub-reaction chamber 15 separated by the partition 18. The phosphine which is decomposed by heat is introduced into the reaction chamber 1 through the supply pipe 6b. When a polysilicon film is formed on each of the semiconductor substrates 2 to have a thickness of 3,000 Å, phosphorus of the impurity is formed in and added to the polysilicon film. Thereafter, the valves are closed, the reaction chamber 1 is set from a vacuum state to an atmospheric state, and the semiconductor substrates 2 each having the phosphorus-doped polysilicon film are taken from the reaction chamber 1.

After the semiconductor substrates 2 obtained as described above were annealed at a temperature of 900° C. in an $N_2$ atmosphere, the impurity concentration of the phosphorus-doped polysilicon films was measured. The result is shown in FIG. 2. In FIG. 2, the abscissa represents distances from the gas supply port of the second gas supply pipe 6 to the substrates, and the ordinate represents the impurity concentration in the semiconductor film. As shown in FIG. 2, almost no change is caused in phosphorus concentration by the distance from the gas supply port to the semiconductor substrates, i.e., a uniform impurity concentration distribution is obtained. The thicknesses of the polysilicon films deposited on the semiconductor substrates are uniform due to the following reason. Conventionally, impurity concentrations of the semiconductor substrates are different from one another because thermal decomposition rates of monosilane and phosphine are different and because the concentration of phosphine is low under the same condition. However, according to the above embodiment, since phosphine is introduced into the sub-reaction chamber 15 and decomposed by heat before the phosphine is introduced into the reaction chamber 1, the concentration of phosphine in the reaction chamber 1 may be increased. For this reason, the semiconductor substrates have a uniform impurity concentration distribution.

As modifications of the embodiment, the temperature in the reaction chamber is varied within a range of 300° C. to 1,000° C., and the pressure in the reaction chamber is varied within a range of 1 mTorr to 10 Torr. Under the conditions, when semiconductor substrates each having a phosphorus-doped polysilicon film are formed, films having uniform and high phosphorus concentration are provided.

Figure 3:
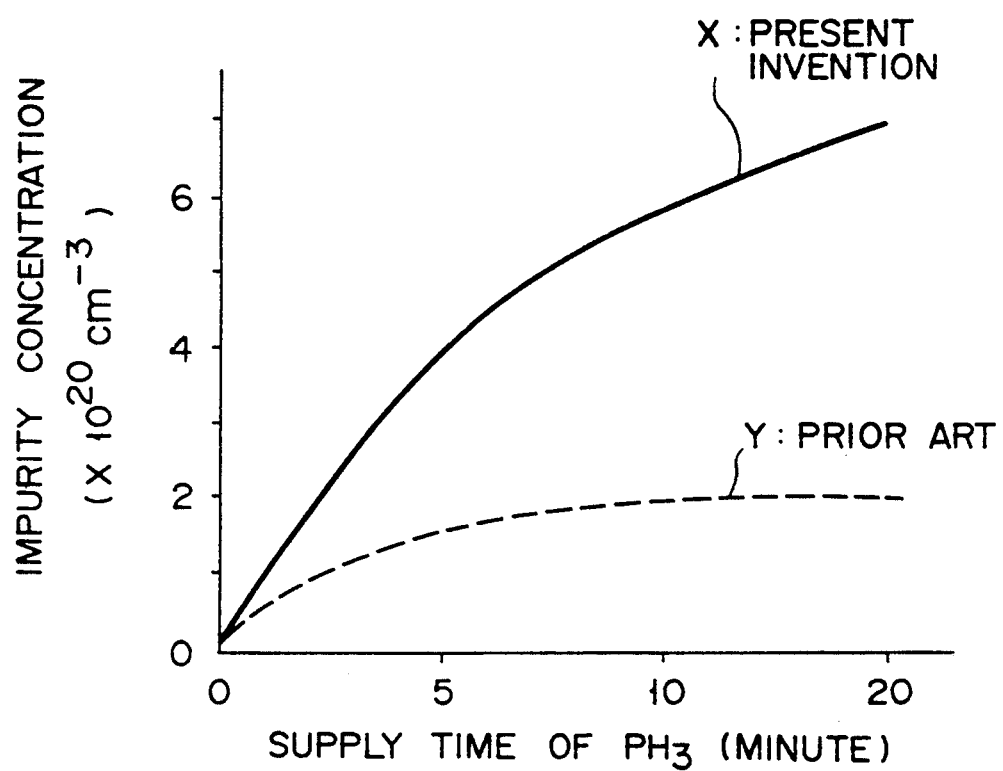
FIG. 3 is a graph showing a relation between an impurity concentration in the semiconductor film and a phosphine supply time.

The second embodiment of the present invention will be described below with reference to FIGS. 1 and 3. FIG. 3 is a graph showing an impurity concentration in a semiconductor film as a function of a phosphine supply time.

In the second embodiment, the same apparatus as described in the first embodiment is used. A semiconductor film is deposited on a substrate by independently introducing the raw gas and the impurity gas into the reaction chamber, as will be described below.

The reaction chamber 1 and the sub-reaction chamber 15 are set at the same temperature and pressure as in the first embodiment, and semiconductor substrates 2 are placed in the reaction chamber 1. While the second valve 10 is set in a closed state, the first valve 9 is opened to supply monosilane to the reaction chamber 1 at a flow rate of 100 SCCM. A polysilicon film is deposited on each of the substrates 2 to have a thickness of 500 Å. Subsequently, the first valve 9 is closed, and the second and third values 10 and 16 are opened to introduce phosphine into the reaction chamber 1 at a flow rate of 10 SCCM while phosphine is decomposed in the sub-reaction chamber 15. At this time, a time for introducing phosphine into the reaction chamber 1 is set to obtain a desired phosphorus concentration in the polysilicon film. When predetermined supply of phosphine is finished, the second valve 10 is closed. In addition, the monosilane and phosphine are repeatedly introduced into the reaction chamber 1 six times, thereby depositing a polysilicon film having a desired phosphorus concentration on the semiconductor substrate to have a thickness of 3,000 Å.

After the semiconductor substrates 2 obtained as described above were annealed at a temperature of 900° C. in an $N_2$ atmosphere, the phosphorus concentration in the phosphorus-doped polysilicon films was measured using a fluorescent X-ray. In this case, the following result was obtained. In FIG. 3, the abscissa represents a time for introducing phosphine into the reaction chamber 1, and the ordinate represents the impurity concentration in the semiconductor films. The solid line X illustrates the result obtained by this embodiment, and the broken line Y illustrates the result obtained by the conventional method. As shown in FIG. 3, the impurity concentration of the conventional method is constant when the supply time exceeds 10 minutes or more. According to the embodiment, the phosphorus concentration in the polysilicon films is increased in proportion to the time for introducing phosphine into the reaction chamber 1.

According to the second embodiment of the present invention, semiconductor substrates each having the polysilicon film having a uniform thickness and a uniform, high phosphorus concentration can be obtained.

In addition to the above embodiment, when films are deposited under a condition wherein the temperature and pressure in the reaction chamber are varied within the same range as in the first embodiment, the uniform thickness and the uniform, high phosphorus concentration may be also obtained.

The third embodiment of the present invention will be described below with reference to FIG. 4.

Figure 4:
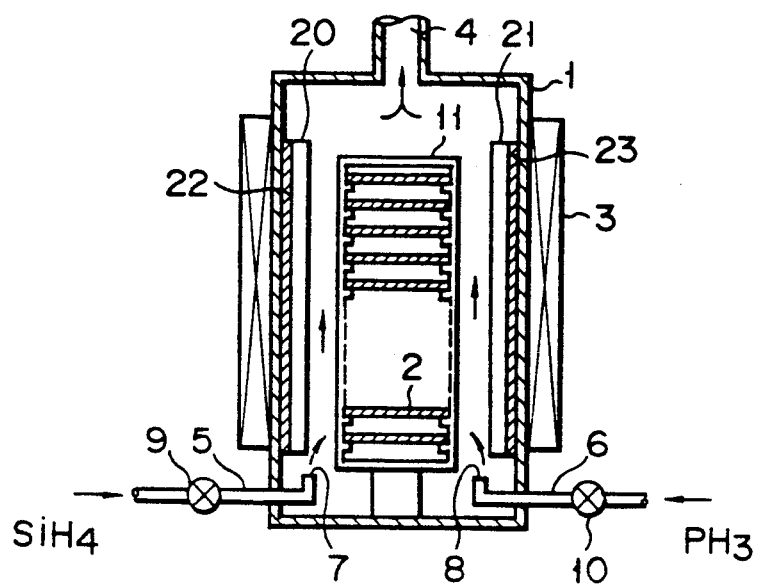
FIG. 4 is a view showing an apparatus for forming a semiconductor film on semiconductor substrates according to the third embodiment of the present invention.

FIG. 4 is a schematic view showing an apparatus for forming a semiconductor film of semiconductor substrates according to the third embodiment of the present invention. Reference numerals 20 and 21 respectively denote discharge electrodes. These electrodes have an arc-shaped configuration in a horizontal cross-section and are arranged on the inner surface of the reaction chamber 1 through insulating films 22 and 23 so as to oppose each other across the boat 11. The discharge electrodes 20 and 21 are connected to a power source (not shown) through a switch to perform plasma discharge in the reaction chamber 1 by applying a voltage therebetween.

A method of forming a semiconductor film on a substrate using the device arranged as described above will be described below. After a plurality of semiconductor substrates 2 held by the boat 11 are placed in the reaction chamber 1, the reaction chamber 1 is evacuated by a vacuum pump to have a predetermined pressure, and the inside of the reaction chamber 1 is held at a predetermined temperature by the heater 3. Subsequently, while the reaction chamber 1 is continuously evacuated by the vacuum pump, only the first valve 9 is opened to introduce monosilane into the reaction chamber 1 through the supply port 7 of the first gas supply pipe 5 at a predetermined flow rate. At this time, a second valve 10 is closed. A polysilicon film is formed on each of the semiconductor substrates 2 to have a predetermined thickness thinner than a final thickness. Thereafter, the first valve 9 is closed, and the switch is turned on to apply a predetermined voltage between the discharge electrodes 20 and 21, thereby setting a condition wherein a plasma discharge can be performed in the reaction chamber 1. The second valve 10 is opened to introduce the phosphine into the reaction chamber 1 through the supply port 8 of the second gas supply pipe 6 at a predetermined flow rate. The phosphine is subjected to the plasma discharge so as to be decomposed. Phosphorus is then added to the polysilicon film deposited on the semiconductor substrate 2. After predetermined doping of phosphorus is finished, the second valve 10 is closed, and the switch is turned off to stop the plasma discharge. In this case, monosilane and phosphine are alternately, separately introduced into the reaction chamber 1 in the above procedures, and the deposition of polysilicon film and the doping of phosphorus are repeatedly performed. Therefore, the polysilicon film on the semiconductor substrate may become the phosphorus-doped polysilicon film having a final thickness. Thereafter, the switch is turned off to close the valves, the reaction chamber 1 is set from the vacuum state to an atmospheric state, and the semiconductor substrates 2 are taken from the reaction chamber 1.

According to the embodiment described above, similar to the second embodiment of the present invention, a semiconductor film having a uniform thickness and a uniform, high phosphorus concentration can be deposited on the substrates.

The fourth embodiment of the present invention will be described with reference to FIG. 5.

Figure 5:
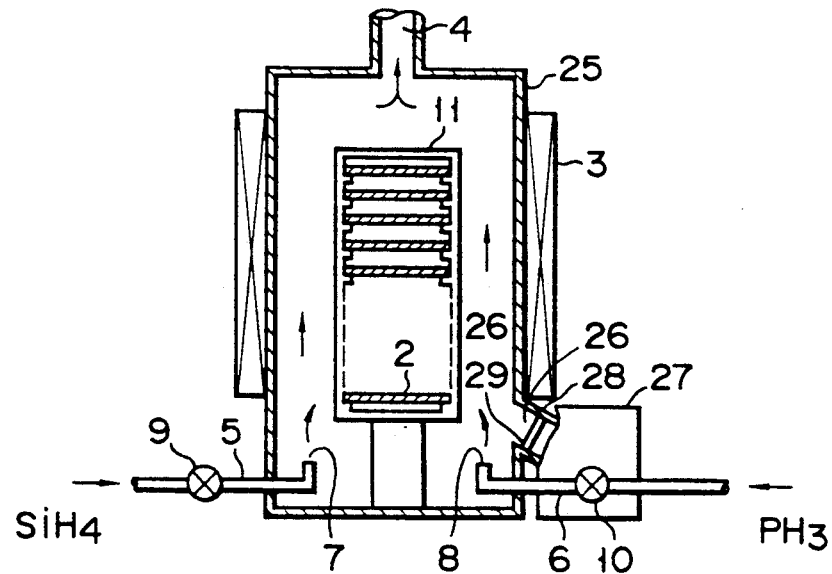
FIG. 5 is a schematic view showing an apparatus for forming a semiconductor film on semiconductor substrates according to the fourth embodiment of the present invention.
Figure 6:
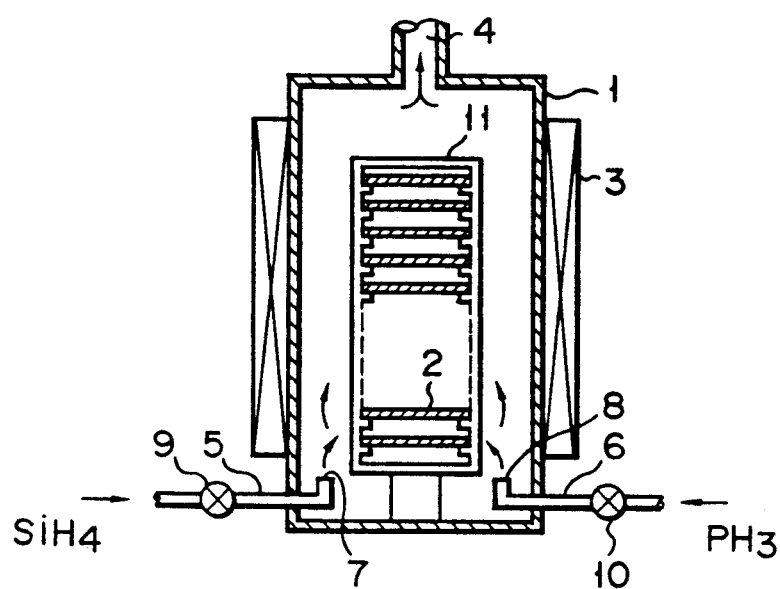
FIG. 6 is a schematic view showing an arrangement of a conventional manufacturing apparatus.
Figure 7:
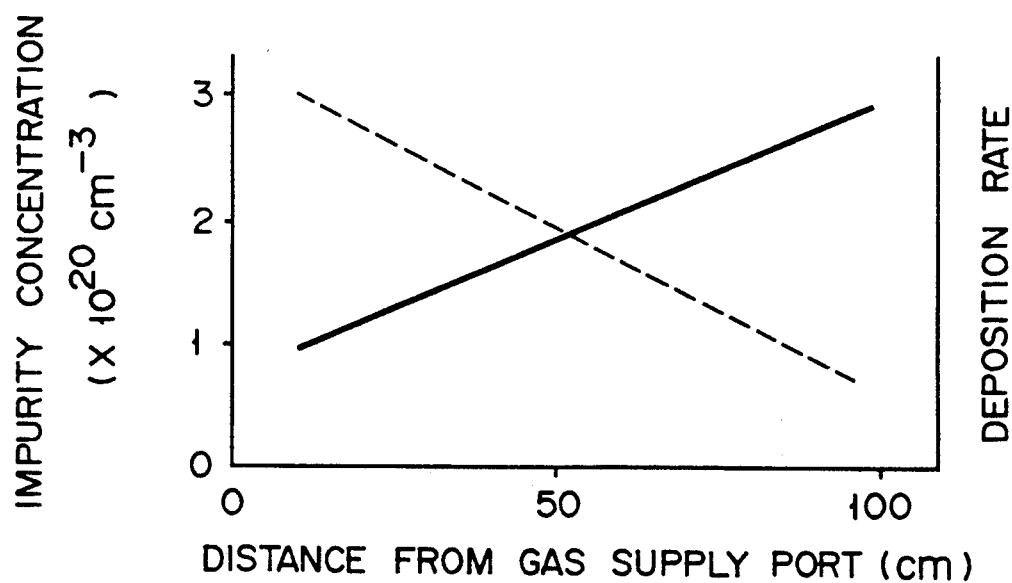
FIG. 7 is a graph illustrating a deposition rate of a conventional semiconductor film.

FIG. 5 is a schematic view showing an apparatus for forming a semiconductor film on semiconductor substrates according to the fourth embodiment of the present invention. Reference numeral 25 denotes a vertical reaction chamber, and the reference numeral 26 denotes a light-supply port which is provided at the lower portion of the reaction chamber 25 in order to apply radiant light to the reaction chamber 25. A guide path 28 for guiding the radiant light from a radiant light source 27 is connected to the light-supply port 26, and a transparent member 29 through which the radiant light is transmitted is tightly sealed to the light-supply port 26. Ultraviolet rays are used as the radiant light from the radiant light source 27, and halogen lamps, mercury lamps, or the like may be used as the radiant ray source 27.

In the apparatus arranged as described above, a method for forming a semiconductor film on a substrate will be described below. Although phosphine is decomposed by the plasma discharge in the third embodiment, phosphine is decomposed by the radiant light in the fourth embodiment.

Similar to the third embodiment, a polysilicon film is formed on semiconductor substrates to have a predetermined thickness thinner than a final thickness. A first valve 9 is closed. While the radiant light from the radiant light source 27 is applied to the reaction chamber 25 through the light-supply port 26, the second valve 10 is opened to introduce phosphine into reaction chamber 25 through the supply port 8 of the second gas supply pipe 6 at a predetermined flow rate. The phosphine is excited by the radiant light and is decomposed, whereby phosphorus is added to the polysilicon film deposited on the semiconductor substrates 2. After predetermined doping of phosphorus is finished, the second valve 10 is closed to stop the application of the radiant light from the radiant ray source 27. In addition, monosilane and phosphine are alternately, separately introduced into the reaction chamber 25 in the above procedures, and the deposition of the polysilicon film and the addition of phosphorus are repeatedly performed, thereby forming a phosphorus-doped polysilicon film having a predetermined final thickness on each of the semiconductor substrate. Thereafter, the supply of the radiant light is stopped, and the valves are closed. The reaction chamber 25 is set from the vacuum state to the atmospheric state, and semiconductor substrates 2 are taken from the reaction chamber 25. According to the embodiment, similar to the second and third embodiments, semiconductor substrates each having the polysilicon film having the uniform thickness and the high, uniform phosphorus concentration can be obtained.

In the third and fourth embodiments, the impurity gas is subjected to the plasma discharge or the excitation in the reaction chamber. However, such a decomposition of the impurity gas may be performed in the sub-reaction chamber as described in the first embodiment, and the decomposed gas may be then introduced into the reaction chamber. In addition, the radiant light is not limited to the ultraviolet rays, and the radiant light with a wavelength having a high decomposition efficiency may be selected. Further, the source and impurity gases are not limited to the above gases. Dichlorosilane ($SiH_2Cl_2$) may be used as the raw gases, and diborane ($B_2H_6$), arsine ($AsH_3$), or the like may be used as the impurity gases. Various changes and modifications may be effected without departing from the spirit and scope of the invention.

As is apparent from the above description, according to the present invention, when the impurity-doped semiconductor film is formed on semiconductor substrates, the raw and impurity gases within the reaction chamber are separately decomposed by different means to provide the semiconductor film thereon. Therefore, the semiconductor film having the uniform thickness and the high, uniform impurity concentration may be provided, and productivity of the semiconductor film may be also improved.

It is further understood by those skilled in the art that the foregoing description is preferred embodiments and that various changes and modifications may be made in the invention without departing from the spirit and scope thereof.

What is claimed is:

1. A method of depositing a doped semiconductor film on a plurality of semiconductor substrates comprising the steps of:

placing said plurality of semiconductor substrates in a reduced pressure reaction chamber;

introducing a raw gas for semiconductor film into said reduced pressure reaction chamber to deposit an undoped semiconductor film on each of said plurality of semiconductor substrates;

decomposing an impurity raw gas in a sub-reaction chamber to produce a decomposed impurity gas;

introducing said decomposed impurity gas into said reduced pressure reaction chamber to dope said undoped semiconductor film with the dopant impurity; and repeating the introducing and decomposing steps several times to deposit said doped semiconductor film on each of said plurality of semiconductor substrates to a predetermined thickness.

2. The method according to claim 1, wherein said doped semiconductor film is annealed in a nitrogen atmosphere at 900° C.

3. The method according to claim 1, wherein the predetermined thickness of said undoped semiconductor film is 500 Å.

4. The method according to claim 1, wherein a thickness of said doped semiconductor film is 3000 Å.

5. The method according to claim 1, wherein said raw gas for semiconductor film is selected from the group consisting of silane and dichlorosilane.

6. The method according to claim 1, wherein said impurity raw gas is selected from the group consisting of phosphine, diborane, and arsine.

7. The method according to claim 1, wherein said sub-reaction chamber has a partition along which said impurity raw gas flows.

* * * * *